United States Patent [19]

Nakai

[11] Patent Number: 4,949,185
[45] Date of Patent: Aug. 14, 1990

[54] COLOR IMAGE RECORDER USING COLOR MASKS WITH IDENTIFYING MARKS

[75] Inventor: Hitoshi Nakai, Nagoya, Japan

[73] Assignee: Brother Kogyo Kabushiki Kaisha, Japan

[21] Appl. No.: 398,978

[22] Filed: Aug. 28, 1989

[30] Foreign Application Priority Data

Sep. 1, 1988 [JP] Japan ................ 63-219548

[51] Int. Cl.⁵ .............. B41J 2/465; G01D 15/14; H04N 1/29
[52] U.S. Cl. .................. 358/300; 346/107 R; 346/108; 346/160; 346/160.1; 346/157; 358/302; 358/75
[58] Field of Search ............. 358/300, 302, 75, 296; 346/107 R, 108, 160, 160.1, 157, 150, 153.1; 355/32, 326, 327; 250/318

[56] References Cited

U.S. PATENT DOCUMENTS

| | | | |
|---|---|---|---|
| 4,772,922 | 9/1988 | Kawahara | 355/32 |
| 4,782,352 | 11/1988 | Misono | 346/160.1 |
| 4,785,316 | 11/1988 | Yamamoto | 346/160.1 |
| 4,810,614 | 3/1989 | Sangyoji . | |
| 4,825,256 | 4/1989 | Nakai | 346/150 |
| 4,864,353 | 9/1989 | Okamoto | 346/150 |
| 4,893,010 | 1/1990 | Tomatsu | 250/318 |

*Primary Examiner*—Bruce A. Reynolds
*Assistant Examiner*—Scott A. Rogers
*Attorney, Agent, or Firm*—Oliff & Berridge

[57] ABSTRACT

A color image recording apparatus exposes a photosensitive recording medium to light through a succession of mask members produced by a monochoromatic laser printer based on colored image information. A latent image thus formed on the recording medium is then developed into a colored image on a color developer sheet. The mask members have identifying marks indicating the colors of the mask members. The color image recording apparatus includes mask member identifying sensors for identifying the identifying marks, a plurality of storage trays each for storing one of the mask members, and feed rollers for individually feeding the mask members from the storage trays. The mask member having one specific color is positioned at an exposure zone where a filter having a corresponding color is provided.

5 Claims, 3 Drawing Sheets

COLOR IMAGE RECORDER USING COLOR MASKS WITH IDENTIFYING MARKS

BACKGROUND OF THE INVENTION

The present invention relates to a color image recording apparatus for recording a colored image on a photosensitive recording medium.

One conventional method for recording a colored image on a color photosensitive recording medium (hereinafter also referred to as "photosensitive sheet") employs color separation filters of red (R), green (G) and blue (B) for producing color-separated mask members from an original color image. The photosensitive sheet is exposed to light successively through these mask members. There is also known a process for applying white light directly to a colored original image and exposing a photosensitive sheet to light reflected by the colored original image. The former colored image recording method is more efficient than the latter process in that the intensity of exposure energy required to be applied to the photosensitive recording medium by the former method is much smaller than that required by the latter process.

One inhouse proposal has been made with respect to a color image recording apparatus for electrophotographically producing mask members using toner as a light-shielding substance on a light transmissive sheet, and exposing a photosensitive sheet to light through such mask members for reproducing a colored image on the photosensitive sheet.

Further, subsequent inhouse proposal has been made as described in a copending U.S. Pat. Application Ser. No. 184,576 filed on Apr. 21, 1988 regarding a color image recording apparatus for producing mask members using a commercially available monochoromatic printer such as a laser beam printer, and reproducing a colored image in the same manner as disclosed in the above proposal. In the recording apparatus disclosed in the copending application, the mask members of red (R), green (G) and blue (B) are printed on ordinary paper sheets of cut form by the monochromatic printer, and monochromatic lights of red (R). green (G) and blue (B) are applied successively to a photosensitive recording medium through the mask members. Since the mask members are produced on the ordinary plane papers, maintenance and handling to the mask members are facilitated, and the mask members are convenient to use especially when a number of colored images are to be produced using the same mask members or a colored image is to be reproduced at a later time using the mask members.

There has been also another inhouse proposal regarding an image recording apparatus in which mask members produced on respective cut sheets have respective identification marks indicating the colors of the mask members. This apparatus has a sensor for reading the identification marks on the mask members that have been delivered to an exposure position, so that the colors of lights to be applied through the mask members to a photosensitive sheet can automatically be selected so as to correspond to the mask members in use. This apparatus allows the photosensitive sheet to be exposed to lights of desired colors irrespective of the sequence in which the mask members may be delivered to the exposure position. Therefore, the mask members may be manufactured in any desired order by a monochromatic printer, and the manufactured mask members may be inserted in any desired order into the color image recording apparatus, since a colored light corresponding to the applied mask member is irradiatable.

Further, in the copending U.S. Pat. Application Ser. No. 184,576, now U.S. Pat. No. 4,884,082 issued Nov. 28, 1989, which discloses the color image recording apparatus using the mask members, a mask member circulating passage is provided for repeatedly feeding the mask members to the exposure position and for positioning them when a number of colored images are to be reproduced from one set of such mask members. With the mask member circulating passage, it is not necessary to prepare mask members again on a monochromatic printer or to insert the mask members manually into a mask member feeder each time a colored image is to be reproduced. Consequently, color images can be recorded at a high speed.

The color image recording apparatus according to the subsequent inhouse proposal has three fluorescent lamps for emitting lights having wavelengths corresponding to red (R), green (G) and blue (B). However, these three fluorescent lamps and their respective starter circuits render an overall size and require large space, and make the color image recording apparatus expensive to manufacture.

To avoid this drawback, there has been know a process for using a light source for emitting white color light, producing lights of red, green end blue from the white color light using color separation filters of the corresponding colors, end exposing a photosensitive sheet to the color-separated lights.

With such arrangement and the color image recording apparatus disclosed in the copending U.S. application, it has to be determined which mask member has been delivered into the exposure unit, and then a desired one, which corresponds to the determined mask member, of the color separation filters must be brought into a position in the path of light from the light source. Therefore, it takes some time until the desired color separation filter is positioned in place. If the mask members are inserted in a sequence different from the order in which the color separation filters are successively brought into the path of light from the light source, then the color separation filters must be switched around each time and exposure cycle is to be carried out, resulting in a time loss. Such a time loss is increased especially when a number of colored images should be produced using one set of mask members.

SUMMARY OF THE INVENTION

In view of the aforesaid shortcomings of the inhouse image recording apparatus, it is an object of the present invention to provide a color image recording apparatus which allows mask members of red, green and blue and color separation filters to be combined into desired combinations within a short period of time so that a number of colored images can be recorded in a short interval of time, irrespective of the order in which the mask members reach an exposure unit.

According to the present invention, these and other objects can be attained by providing a color image recording apparatus for exposing a photosensitive recording medium to light through a succession of mask members prepared based on colored image information to form a latent image on the photosensitive recording medium, and developing the latent image into a colored visible image, the color image recording apparatus comprising: each of the mask members being formed with identifying marks indicative of the color of the mask member, mask member identifying means for detecting the identifying marks, the identifying means generating an output signal indicative of the color of the mask member, exposure means providing an exposure zone for exposing the photosensitive recording medium to color-separated light from the mask member, the exposure means being positioned downstream of the mask member identifying means, means for changing the color-separated lights in the exposure means in response to the output signal from the mask member identifying means, and a mask member transfer means positioned upstream of the exposure means for transferring the mask member to the exposure zone.

With the above arrangement, the mask member identifying marks on the mask members are read by mask member identifying sensors to determine the colors of the mask members. When the mask members are to be stored in the storage means or storage trays, empty storage trays are selected and the mask members are directed to the selected storage trays by a gate, so that the colors of the mask members stored in the storage trays can be recognized. The exposure means includes filter position detecting means for detecting the color of next light to which the photosensitive recording medium is to be exposed.

Therefore, a mask member which matches the color of next light to which the photosensitive recording medium is to be exposed can be delivered from one of the storage trays into the exposure position.

The above and other objects, features and advantages of the present invention will become more apparent from the following description when taken in conjunction with the accompanying drawings in which a preferred embodiment of the present invention is shown by way of illustrative example.

DETAILED DESCRIPTION OF THE PREFERRED EMBODIMENT

Figure 1:
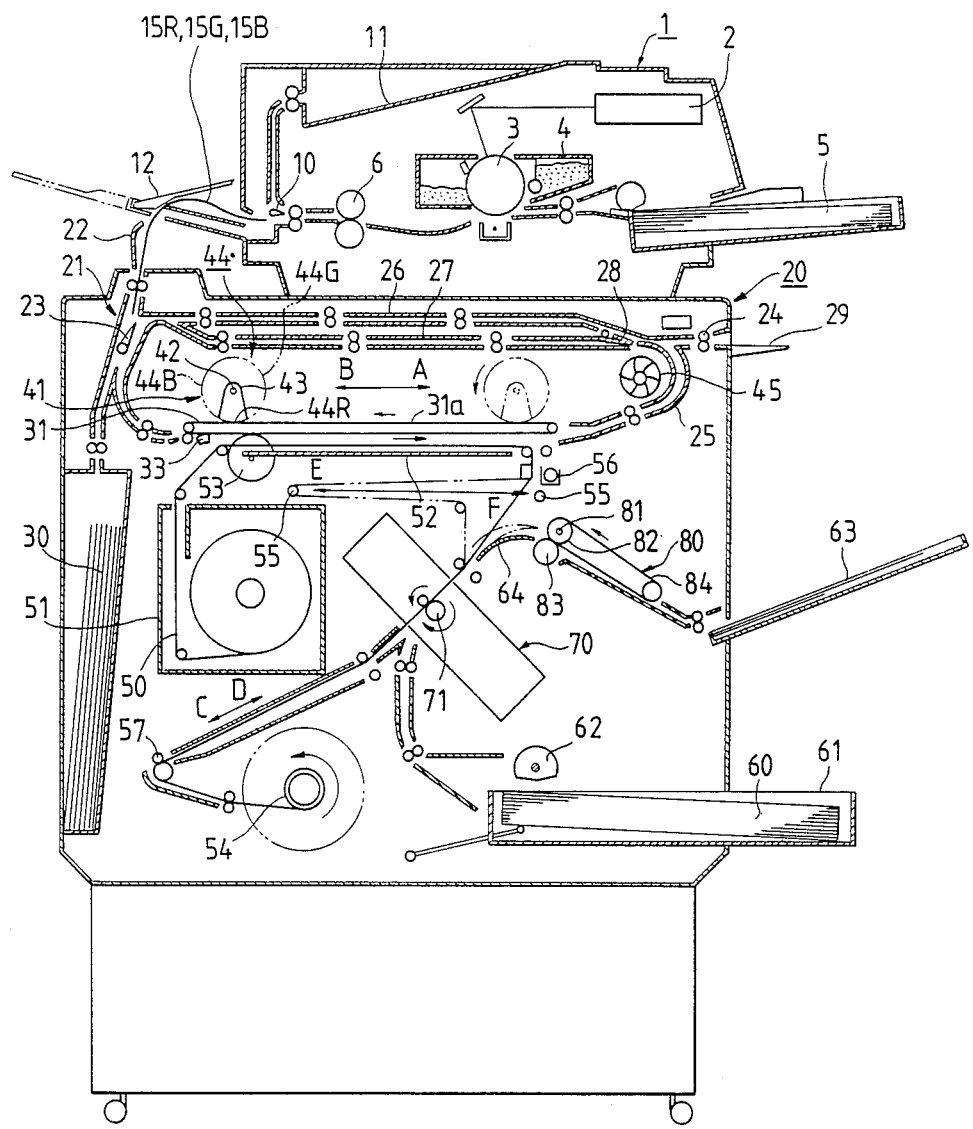
FIG. 1 is a schematic vertical cross-sectional view showing color image recording apparatus according to the present invention.

FIG. 1 shows a color image recording apparatus 20 according to the present invention which is coupled to a monochromatic laser printer 1.

The laser printer 1 is placed on the top of the color image recording apparatus 20. The laser printer I has a polygon scanner 2 which applies a laser beam to an electrically charged photosensitive member such as a drum 3 to form an electrostatic latent image thereon. The electrostatic latent image on the photosensitive member 3 is then developed into a visible toner image by a developing unit 4. The toner image is thereafter transferred from the photosensitive drum 3 onto a sheet of a plane paper or an OHP sheet supplied from a sheet cassette 5, and then fixed by a fixing unit 6. The monochoromatic laser printer i records data transmitted from a host computer (not shown) on sheets.

If a black-and-white image (monochromatic output image) is to be reproduced, then the printed sheet from the laser printer 1 is discharged by a sheet path selector 10 onto a discharge tray 11 or 12. If colored image is to be reproduced, then the printed sheet from the laser printer 1 is first discharged onto the discharge tray 12, and then fed into the color image recording apparatus 20.

The distal end of the discharge tray !2 is angularly movable between solid line position and a chain line position as shown in FIG. 1. When it is in the solid-line position, the printed sheet from the laser printer i is guided into the color image recording apparatus 20. A set of three monochoromatically printed sheets from the layer printer 1 is used as a set of mask members 15R, 15G, 15B (also referred to collectively as a mask member or members 15) in the color image recording apparatus 20.

The construction of the color image recording apparatus 20 will be described below.

The color image recording apparatus 20 has a mask member feeder 21 disposed in an upper portion in an apparatus housing. The mask member feeder 21 includes a positioning unit 31, a circulation guide 25, and two parallel upper and lower storage trays 26, 27, which are coupled in a circulatory pattern. The junction between the positioning unit 31 and the storage trays 26, 27 is connected to the discharge tray 12 of the monochromatic laser printer through a guide member 22, so that a printed sheet (mask member) from the monochoromatic laser printer is introduced into the mask member feeder 21.

Figure 2:
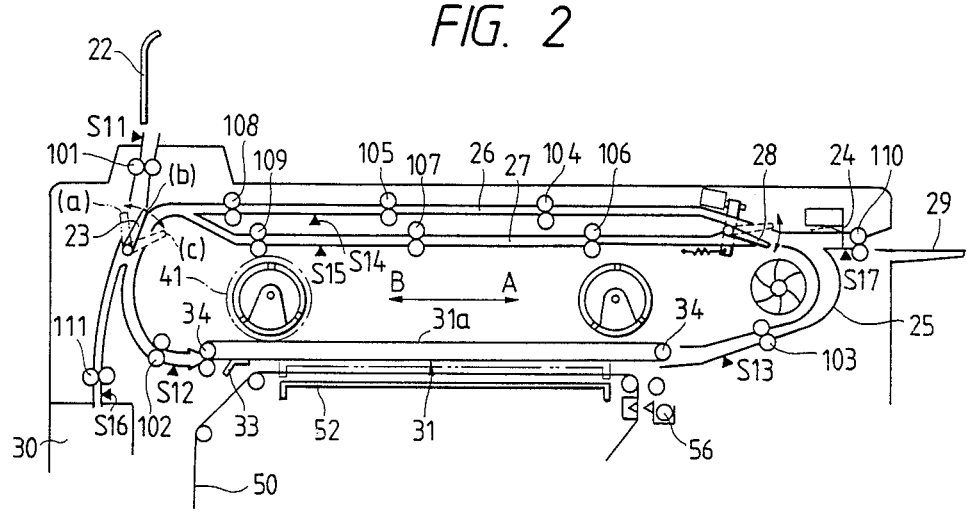
FIG. 2 is an enlarged schematic cross-sectional view showing a mask member feeder, an exposure device and a positioning unit in the color image recording apparatus.

The mask member feeder 21 is shown in detail in FIG. 2. The mask member feeder 21 includes a swingable gate 23 for selectively directing mask member 15, which has been guided by the guide member 22, toward the positioning unit 31 or a discharge tray 30. Further, a swingable gate 28 is disposed between the circulation gate 25 and the storage trays 26, 27. The gate 28 directs a mask member 15, which has been guided by the circulation guide 25, into the upper storage tray 26 or the lower storage tray 27. A mask member 15 which has been inserted from a manual feed tray 29 can be introduced into the mask member feeder 21 through a gate 24.

The mask member feeder 21 has a plurality of pairs of sheet feed rollers 101 thru 111. The rollers 108,109 are drivable independently of each other through respective clutches (not shown). The rollers 108,109 are rotatable only when the clutches are coupled, so that they can feed out mask members when required. Other rollers 101 thru 107 and 110 and 111 are rotatable at all times during operation of the apparatus 20. The peripheral speed of the rollers 101,102,108,109 is slightly lower than the peripheral speed of a feed belt 31a of the positioning unit 31. The drive sources for these rollers 101, 102, 108, 109 have one-way clutches. Thus, the mask member is prevented from being looped or getting jammed at the entrance of the positioning unit 31. The peripheral speed of the rollers 103 thru 107 is slightly higher than the peripheral speed of the feed belt 31a of the positioning unit 31, so that when the mask member 15 is discharged from the positioning device 31 the mask member 15 is not looped or jammed in the circulation guide 25. The rollers 104 thru 107 impose somewhat weak feeding forces on mask members 15 such that before the roller 108 or 109 starts being rotated upon coupling of its clutch, these rollers 104–107 can slip against the mask members 15 to prevent them from being looped in the storage tray 26,27.

The mask member feeder 21 also has mask member sensors S11,S12,S13,S14,S15,S16 and S17. These mask member sensors are defined nomenclaturally and functionally as follows:

S11: first input sensor for detecting the introduction of a mask member 15 from the monochromatic laser printer 1 and generating an operation start signal for the mask member feeder 21.

S12: second input sensor for detecting the leading end of a mask member 15 and then, upon elapse of a certain period of time, generating an operation start signal for the positioning unit 31a.

S13: circulatory path sensor for detecting a jam of a mask member 15 in the circulatory path.

S14: upper storage tray sensor for detecting whether there is a mask member in the upper storage tray 26.

S15: lower storage tray sensor for detecting whether there is a mask member in the lower storage tray 27.

S16: discharge jam sensor for detecting a jam of a mask member in the discharge tray 30.

S17: manual feed sensor for detecting whether there is a mask member which is manually inserted.

The feed belt 31a of the positioning unit 31 is in the form of an endless belt made of a light-transmissive dielectric material such as polyethylene terephthalate (PET). The feed belt 31a is trained around two spaced shaft 34. At least one of the shafts 34 is rotatable about its own axis by a motor (not shown) for circulating the belt 31a in the direction indicated by an arrow in FIG. 1. The surface of the feed belt 31a is electrically charged by an electric charger such as a corotoron (not shown) for electrostatically attracting the mask member 15. A sensor bar 33 supporting positioning mark sensors and mask member identifying mark sensors is positioned near one end of the feed belt 31a. The positioning mark sensors serve to read positioning marks printed on predetermined portion of a mask member 15 for locating the mask member 15 in a given position, and the mask member identifying mark sensors serve to identifying the color of the mask member 15 as described below.

Figure 3:
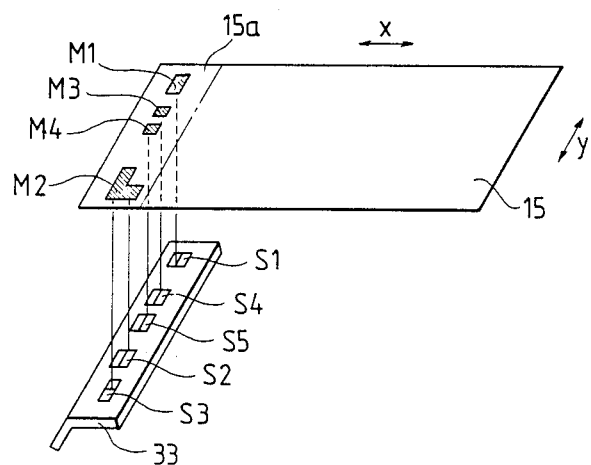
FIG. 3 is a perspective view for descriptions of positioning marks and mask member identifying marks on a mask member and positioning mark sensors and mask member identifying mark sensors on a sensor bar.

FIG. 3 shows in detail the sensor bar 13 and the mask member 15. The mask member 15 includes a non-image area 15a bearing a mark M1 for indicating the position of the mask member 15 in the direction indicated by &he arrow x, a mark M2 for indicating the position of the mask member 15 in the direction indicated by the arrow y, and marks M3,M4 for indicating the color of the mask member 15. The sensor bar 33 has sensors S1 thru S5. The sensors S1 and S2 are adapted for detecting the position of the mask member 15 in the direction indicated by the arrow x by sensing the marks M1,M2, respectively. The sensor S3 is adapted for detecting the position of the mask member 15 in the direction indicated by the arrow y by sensing the mark M2. The sensors S4 and S5 are adapted for identifying the mask member 15 by sensing the marks M3,M4, respectively. Each of these sensors is in the form of a light-reflecting sensor comprising an LED and a photodiode, and senses the mark based on the difference between the reflectances of the mark and the background surface of the non-image area 15a.

An exposure device 41 is disposed above the positioning unit 31. The exposure device 41 is movable horizontally along the positioning unit 31.

Figure 4A:
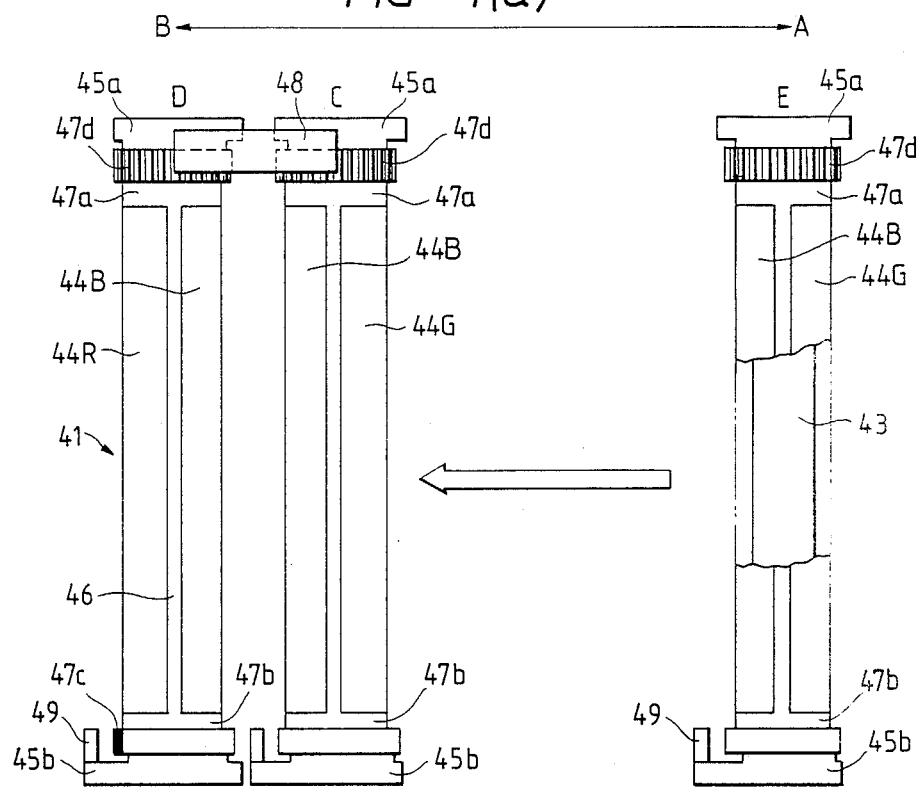
FIGS. 4(a) and 4(b) are plan and cross-sectional views of the exposure device, the views showing the manner in which the exposure device moves over its stroke and switches color separation filters.
Figure 4B:
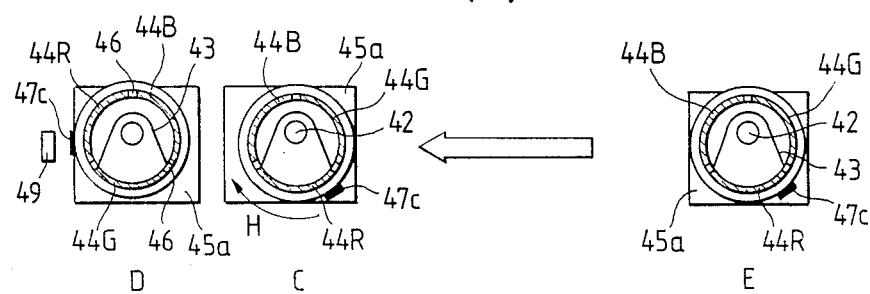

FIGS. 4(a) and 4(b) illustrate the exposure device 41 in greater detail.

The exposure device 41 comprises a linear light source 42 which emits white color light, a reflecting member 42 for reflecting light from the light source 432 in one direction, a cylindrical frame 46 having three independent openings defined therein at substantially equal circumferential intervals and supporting color separation filters 44R,44G,44B of red, green, blue therein, a pair of axially spaced cylindrical supports 47a,47b supporting the frame 46 and rotatable therewith, the cylindrical support 47a supporting a gear 47d on its outer end, and a pair of axially spaced rectangular frames 45a,45b on which the respective supports 47a,47b are rotatably supported. The frames 45a, 45b are joined to each other by a tie plate (not shown), thus making the exposure device 41 unitary in structure.

One of the color separation filters 44R,44G,44B is positioned in the opening o the reflecting member 43, i.e., directly below the light source 42. In illustrated embodiment, the filter 44R is positioned below the light source 42. The exposure device 41 is bodily movable reciprocally in the directions indicated by arrows A,B by means of a suitable actuator for applying light to a desired area on a photosensitive recording medium. The support 47a houses a one-way clutch (not shown) which allows the cylindrical frame 46 to rotate in the direction indicated by an arrow H only when the exposure device 41 moves back in the direction indicated by the arrow B from a position C to a home position D while the gear 47d on the support 47a is brought into meshing engagement with a fixed rack 48. When the cylindrical frame 46 is thus rotated, another color separation filter, here the filter 44G, is angularly moved into the position below the light source 42.

In operation, the exposure device 41 is moved in the direction indicated by the arrow A toward a position E at the righthand end of its stroke while light from the light source 42 is radiated out through the red filter 44R for scanning exposure. Thereafter, the light source 42 is deenergized, and the exposure device 41 is moved back in the direction indicated by the arrow B. On the backward stroke, the gear 47d on the support 47a meshes with the rack 48 in the position C, thus rotating the frame 46 in the direction indicated by the arrow H. When the exposure device 41 reaches the home position D, the next green filter 44G is positioned in the opening of the reflecting member 43 in preparation for a next cycle of scanning exposure.

The support 47b has a reference filter position mark 47c for detecting the reference position of the filters 44R,44G,44B. A reference filter position sensor 49 is positioned such that it faces the reference position mark 47c when the exposure device 41 is in the home position D. The filter which is located directly below the light source 42 or in the opening of the reflecting member 43 can be recognized by counting how many times the filters have changed as detected by the sensor 49.

As described above, the color separation filters 44R,44G,44B are disposed around the linear light source 42 and the reflecting member 43, and are successively brought into the position below the light source 42 In response to the movement of the exposure device 41 itself over its stroke. Accordingly, the exposure device 41 is a space saver and is of a simple and inexpensive structure.

A photosensitive recording medium or sheet 50 is primarily made of a photosetting resins including a photopolymerization initiator known from Japanese Patent Application Kokai No. 62-143044, for example. More specifically, the photosensitive recording medium 50 comprises a base sheet coated with photo-curable resins which will be photo-cured upon exposure to lights having wavelengths of red, green and blue, and microcapsules containing dye precursors of cyan, magenta and yellow. The photosensitive recording medium 50 is housed in a cartridge 51 in a light shielded condition. The photosensitive recording medium 50 which is drawn out of the cartridge 51 passes between the belt 31a and an exposure table 52, goes past a fastening roller 56, a tension roller 55, a movable guide 64, a pressure developing unit 70, and a drive roller 57, and is wound around a takeup roller 54. When the photosensitive recording medium 50 is exposed to light from the exposure device 41, the exposure table 52 is elevated by a cam to bring the photosensitive recording medium 50 into close contact with a mask member 15 which has been fed by the feed belt 31a. While an image is being developed by the pressure developing unit 70, the photosensitive recording medium 50 is gripped and fastened in position by the fastening roller 56, and is also prevented from sagging by the tension roller 55. The drive roller 57 serves to feed the photosensitive recording medium 50 at a constant speed.

A color developer sheet 60 comprises a base sheet coated with a color developer disclosed in Japanese Patent Application Kokai No. 58-88739, for example. A stack of such color developer sheets 60 is stored in a cassette 61 with their coated surfaces facing downwardly. The color developer sheets 60 are fed, one by one, from the cassette 61 by a feed roller 62 which is intermittently operated by an actuator (not shown), and supplied to the pressure developing unit 70. The supplied color developer sheet 60 is placed over the exposed area of the photosensitive recording medium 50, and pressed thereagainst by a pair of pressure rollers 71 in the pressure developing unit 70, whereupon a latent image which has been formed on the photosensitive recording medium 50 by exposure to light from the exposure device 41 is visualized on the color developer sheet 60.

A thermal fixing unit 80 comprises a heat roller 82 with a heater 81 disposed therein, an auxiliary roller 85, an endless belt 84 trained around the heat roller 82 and the auxiliary roller 85, and a pinch roller 83 pressed against the heat roller 82 through the endless belt 84 therebetween. The color developer sheet 60 which has been fed from the pressure developing unit 70 and guided by the movable guide 64 is introduced into the thermal fixing unit 80 in which the color developer sheet 60 is calendered to fix the visualized image. The color developer sheet 60 is then discharged from the thermal fixing unit 80 onto a discharge tray 63.

The color image recording apparatus 20 thus constructed operates as follows:

It is assumed that a red mask member 15R is produced by the monochromatic laser printer 1. The mask member 15R has a toner pattern thereon as a light-shielding image, and light passing through tho mask member 15R except its light-shielding image photocures those microcapsules which contain a dye precursor of cyan on the photosensitive recording medium 50.

At this time, the discharge tray 12 of the monochromatic laser printer 1 is in the solid-line position. The produced mask member 15R is guided by the guide member 22 into the mask member feeder 21 in the color image recording apparatus 20.

If it is confirmed by a sensor in the positioning unit 31 that there is no other mask member present in the positioning unit 31, then the mask member 15R is guided by the gate 23 so that it is fed into the positioning unit 31.

The positioning unit 31 electrostatically attracts the mask member 15R to the feed belt 31a, and feeds the mask member 15 into an exposure position therein. Thereafter, the positioning unit 31 is moved by actuators (not shown) in the directions indicated by the arrows x,y in FIG. 3 until the mask member 15R is properly positioned in the exposure position while the positioning marks M1,M2 on the mask member 15R are being sensed by the positioning mark sensors W1,S2,S3 on the sensor bar 33.

At the same time that the mask member 15R is thus positioned, the mask member identifying marks M3,M4 on the mask member 15R are sensed by the corresponding sensors S4,S6 on the sensor bar 33, so that the color of the mask member 15R is detected by a control unit (not shown). If the filter positioned below the light source 42 of the exposure device 41 does not correspond to the mask member 15R, then, the exposure device 41 is reciprocally moved to angularly rotate the frame 40 until the proper filter 44R is positioned below the light source 42.

Then, the photosensitive recording medium 50 is fastened by the fastening roller 56, and the cam 53 is rotated by an actuator (not shown) to elevate the exposure table 52. The photosensitive recording medium 50 is now held intimately against the feed belt 31a of the positioning unit 31 with the mask member 15R sandwiched therebetween.

When the exposure table 52 is in close contact with the positioning unit 31, the lamp 42 is turned oN, and red light is applied from the red filter 44R through the mask member 15R to the photosensitive recording medium 50 while at the same time it is being scanned by the exposure device 41 in the direction indicated by the arrow A. until the exposure device 41 reaches the position E in FIG. 4(a) and 4(b). After the exposure, the lamp 42 is deenergized, and the exposure device 41 moves back toward the position C in FIGS. 4(a) and 4(b) in the direction indicated by the arrow B. When the exposure device 41 moved from the position C to the home position D, the gear 47d on the support 47a is kept in mesh with the rack 48, rotating the frame 46 and the supports 47a,47b in the direction indicated by the arrow H in FIG. 4(b), until the next green filter 44G is positioned below the lamp 42. While the exposure device 41 is moving back, the exposure table 52 is lowered by the cam 53 so that the photosensitive recording medium 50 is spaced downwardly from the positioning unit 31 and the mask member 15R.

At this time, the photosensitive recording medium 50 is held under back tension by the shaft in its roll in the cartridge 51. When the exposure table 52 is lifted, the length of the photosensitive recording medium 50 which corresponds to the upward displacement of the exposure table 52 is drawn out of the cartridge 51. When the exposure table 52 is lowered after exposure, the length of the photosensitive recording medium 50 which corresponds to the downward displacement of the exposure table 52 is withdrawn into the cartridge 51, thereby taking up any sag in the photosensitive recording medium 50.

After the exposure using the red mask member 15R is completed and the descent of the exposure table 52 is confirmed, the feed belt 31a of the positioning unit 31 is moved to deliver the mask member 15R into the circulation guide 25, from which the red mask member 15R is guided by the gate 28 into the upper storage tray 26.

Then, the green mask member 15G generated by the monochromatic laser printer 1 passes through the guide 22, and is guided by the gate 23 into the positioning unit 31 in which the green mask member 15G is positioned with respect to the photosensitive recording medium 50.

If the filter in the operative position of the exposure device 41 does not correspond to the green mask member 15G at this time, then the exposure device 41 is operated until the proper filter 44G is positioned below the lamp 42.

Then, the exposure table 52 is elevated to hold the photosensitive recording medium 50 and the green mask member 15G closely against the feed belt 31a, and then the lamp 42 is energized to expose the photosensitive recording medium to green light from the green filter 44G. Following the exposure, the exposure table 52 descends, and the green mask member 15G is guided through the circulation guide 25 and introduced by the gate 28 into the lower storage tray 27. The exposure device 41 moves back, and the frame 46 is rotated to position the blue filter 44B below the lamp 42.

The blue mask member 15B generated by the monochromatic laser printer 1 is then delivered by the mask member feeder 21 and positioned by the positioning unit 31. Thereafter, the photosensitive recording medium 50 is exposed to blue light by the exposure device 41. Through the above process, a desired colored latent image is formed on the photosensitive recording medium 50.

Then, the exposure table 52 is lowered and the fastening roller 56 is released from the photosensitive recording medium 50, which is then fed by the drive roller 57 in the direction indicated by the arrow C. At this time, the tension roller 55 and the movable guide 64 are in the solid line position. The pressure rollers 71 of the pressure developing unit 70 are spaced from each other. Therefore, while the photosensitive recording medium 50 is being fed and wound up by the takeup roller 54, the microcapsules on the photosensitive recording medium 50 are not damaged or ruptured by contact with these components. The drive roller 57 is stopped when the trailing end of the latent image on the photosensitive recording medium 50 arrives at the pressure roller 71 of the pressure developing unit 70.

In synchronism with the movement of the photosensitive recording medium 50, a color developer sheet 60 is delivered from the cassette 61 by the sheet feed roller 62. The color developer sheet 60 from the cassette 61 is stopped when its leading edge faces the trailing end of the latent image on the photosensitive recording medium 50.

The pressure rollers 71 of the pressure developing unit 70 are then rotated and held against each other by an actuator (not shown), and the photosensitive recording medium 50 is gripped and fastened by the fastening roller 56. The photosensitive recording medium 50 and the color developer sheet 60 which are held in superposed relation to each other are pressed and fed in the direction indicated by the arrow D. At this time, those microcapsules which are not photo-cured on the photosensitive recording medium 50 are ruptured under pressure, and a colored visible image corresponding to the latent image on the photosensitive recording medium is developed on the color developer sheet 50.

As the pressure roller 71 rotate in the directions indicated by the arrows, the tension roller 50 is moved in the direction indicated by the arrow E, taking up any sag in the photosensitive recording medium 50, while the tension roller 55 moves in the direction indicated by the arrow E. the movable guide 64 is moved by mechanism (not shown) into the solid-line position to separate the leading edge of the color developer sheet 60 from the photosensitive recording medium 50, and guide the color developer sheet 60 toward the thermal fixing unit 80.

In the thermal fixing unit 80, heat energy is applied to the color developer sheet 60 by the heater 81 through the rotating heat roller 82 and the endless belt 84 to promote color development of the colored image. At the same time, a binder polymer is thermally fused on the color developer sheet 60 for securing the color developers to the base sheet. The color developer sheet 60 is now calendered to the same smoothness as that of the surface of the endless belt 84, so that the color developer sheet 60 has a suitable glossy surface.

After the color developing and calendering process, the color developer sheet 60 is separated from the endless belt 84 through a curved path, and discharged onto the discharge tray 63.

During the image developing process and the color developing and calendering process described above, the photosensitive recording medium 50 is gripped and fastened in place by the fastening roller 56. Therefore, the portion of the photosensitive recording medium 50 which is placed on and upstream of the exposure table 52 is not affected by changes in the tension of the photosensitive recording medium 50 downstream of the exposure table 52.

Consequently, while one image on the photosensitive recording medium 50 is being developed, the photosensitive recording medium on the exposure table 52 may be exposed to light to form another colored latent image thereon.

When it is desired to reproduce a plurality of colored images from the same set of mask members 15, the gate 23 in the mask member feeder 21 is angularly shifted to a position (b) in FIG. 2, to guide the mask member 15R stored in the storage tray 26 into the positioning unit 31 again, and the photosensitive recording medium 50 is exposed to light through the mask member 15R. The mask member 15G, 15B are similarly guided from the storage trays 26,27 successively into the positioning unit 31 as soon as the exposure cycle using the previous mask member 15 is finished. The mask member feeder 21 can thus repeatedly circulate the mask members 15 as many times as desired.

After a desired number of colored images have been reproduced from the same set of mask members 15, the gate 23 is further angularly shifted to a position (c) in FIG. 2 to discharge the mask members 15 from the mask member feeder 21 into the discharge tray 30.

If a mask member 15 of a next set happens to be fed from the monochromatic laser printer 1 while a series of colored images are being reproduced in the color image recording apparatus 20, then the gate 23 is angularly moved to the position (b) in FIG. 2 for thereby guiding the mask member 15 from the monochromatic laser printer 1 into the discharge tray 30.

As described above, the mask member feeder 21 is associated with the manual feed tray 29 for allowing a mask member 15, which has been produced by another means, to be manually introduced into the color image recording apparatus 20. A manual feed gate 24 is provided to prevent a mask member from being manually inserted in the event that there has already been another mask member in the mask member feeder 21.

The mask members 15 generated by the monochromatic laser printer 1 or manually inserted from the manual feed tray 29 may not be introduced in the order of mask members of red (R), green (G), and blue (B). In such a case, the mask member feeder 21 operates as follows:

When a first colored image is to be recorded, the mask members 15 are positioned and identified as described above in the positioning unit 31, and the filters of the exposure device 41 are changed so that the corresponding filters are successively positioned below the lamp 42. After the exposure using the mask members 15 for the first colored image, the colors of these mask members 15 are identified, end the gate 28 is angularly shifted to guide the mask members selectively into the storage trays 26,27. Accordingly, the colors of the mask members 15 stored in the storage trays 26,27 are known. The reference filter mark 47c and the reference filter mark sensor 49 in the exposure device 41 can determine which filter is positioned in the path of light from the lamp 42 when the first colored image has been recorded, by counting how many times the filters have changed.

To record subsequent colored images, the mask members 15 are successively supplied from the storage trays 26,27 into the positioning unit 31. At this time, one of the mask members 15 which corresponds to the filter positioned below the lamp 42 is selected and delivered to the positioning unit 31.

With the present invention, as described above, each of the mask members of one set has identifying marks indicating the color of the mask member, and there are provided mask member identifying mark sensors for reading the identifying marks, a reference filter position mark for detecting the positions of color separation filters of an exposure device, and a sensor for detecting the reference filter position mark. Therefore, the color separation filters corresponding to the mask members can automatically be selected irrespective of the order in which the mask members are inserted into an exposure position. As a result, the mask members may be inserted in a random sequence.

The mask members can be repeatedly circulated successively into the exposure position by a mask member feeder which has storage trays for storing the mask members separately, a gate for directing the mask members into the storage trays, and a control means for individually feeding the mask members from the storage trays so as to correspond to the colors of the color separation filters of the exposure device. Even if the mask members are inserted in any random order or sequence when a plurality of colored images are to be recorded from the set of mask members, there is required no time to change the color separation filters depending on the colors of the mask members to be used when the exposure process is carried out to record the second and following colored images. As a result, color images can be recorded at a high speed.

While the invention has been described in detail and with reference to specific embodiment thereof, it would be apparent for those skilled in the art that various changes and modifications can be made therein without departing from the spirit and scope of the invention.

What is claimed is:

1. A color image recording apparatus for exposing a photosensitive recording medium to light through a succession of mask members prepared based on colored image information to form a latent image on the photosensitive recording medium, and developing the latent image into a colored visible image, the color image recording apparatus oomprising:
   each of the mask members being formed with identifying marks indicative of the color of the mask member;
   mask member identifying means for detecting the identifying marks, the identifying means generating an output signal indicative of the color of the mask member;
   exposure means providing an exposure zone for exposing the photosensitive recording medium to color-separated light from the mask member, the exposure means being positioned downstream of the mask member identifying means;
   means for changing the color-separated lights in the exposure means in response to the output signal from the mask member identifying means; and
   a mask member transfer means positioned upstream of the exposure means for transferring the mask member to the exposure zone.

2. The color image recording apparatus as claimed in claim 1, wherein the mask member transfer means comprises;
   a plurality of storage means each for storing one of the mask members, the storage means being positioned upstream of the exposure means; and
   feed means for individually feeding the mask members from the storage means, the feed means having a control means for selectively feeding one of the mask members stored in the storage means.

3. The color image recording apparatus as claimed in claim 1, wherein the exposure means comprises a single light source, and three filters disposed rotatable around the light source, the three filters being arranged circumferentially and equi-distantly, one specific color separated light being generated at one specific angular position of the filter, and wherein the means for changing the color separated lights is connected to the exposure means for changing an angular rotational position of the filter to change the color separated light.

4. The color image recording apparatus as claimed in claim 2, further comprising a filter position detection means for detecting a kind of the filters positioned at the one specific angular position, the filter position detection means generating a signal indicative of the kind of the filters at the specific angular position, and wherein the filter position detection means is connected to the control means for feeding one of the mask members stored in the storage means, which one of the mask members having a color corresponding to a color of the filter positioned at the specific angular rotational position.

5. The color image recording apparatus as claimed in claim 1, wherein the mask member transfer means further comprises a gate member for selectively delivering the mask member to one of the storage means.

* * * * *